United States Patent [19]

De Jaeger et al.

[11] Patent Number: 4,563,410
[45] Date of Patent: Jan. 7, 1986

[54] METHOD FOR THE PREPARATION OF A PLANOGRAPHIC PRINTING PLATE USING NIS CONTAINING NUCLEI

[75] Inventors: Antoine A. De Jaeger, Kessel; Alfons J. Bertels, Olen; Albert L. Poot, Kontich; René M. De Keyzer, Bornem; Francis J. Sels, Kontich, all of Belgium

[73] Assignee: Agfa-Gevaert N.V., Mortsel, Belgium

[21] Appl. No.: 640,551

[22] Filed: Aug. 15, 1984

Related U.S. Application Data

[63] Continuation of Ser. No. 466,656, Feb. 15, 1983, abandoned.

[30] Foreign Application Priority Data

Feb. 19, 1982 [GB] United Kingdom ............. 8205022

[51] Int. Cl.$^4$ ............................. G03C 5/54; G03F 7/06
[52] U.S. Cl. ................................... 430/204; 430/302; 101/464
[58] Field of Search ................. 430/204, 302, 246; 101/464

[56] References Cited

U.S. PATENT DOCUMENTS

| | | | |
|---|---|---|---|
| 3,083,097 | 3/1963 | Lassig et al. | 430/204 |
| 3,721,559 | 3/1973 | De Haes et al. | 430/204 |
| 3,776,728 | 12/1973 | Susuki et al. | 430/204 |
| 3,904,412 | 9/1975 | Serrein et al. | 430/204 |
| 4,220,702 | 9/1980 | Tsabai et al. | 430/204 |
| 4,361,639 | 11/1982 | Kanada et al. | 430/204 |

FOREIGN PATENT DOCUMENTS 1228927  11/1966  Fed. Rep. of Germany ...... 430/204

Primary Examiner—Richard L. Schilling
Attorney, Agent, or Firm—William J. Daniel

[57] ABSTRACT

A method for the preparation of a planographic printing plate wherein a sheet material, which comprises an exterior hydrophilic colloid layer having concentrated on its surface a silver image formed by the silver complex diffusion transfer process with NiS or mixed crystal NiS.Ag$_2$S development nuclei in which the molar ratio of NiS to Ag$_2$S is not smaller than 1:1, is treated with a liquid for hydrophobizing the silver image for planographic printing, such liquid containing in dissolved state a heterocyclic compound corresponding to one of the following tautomeric structures (A) and (B) or (C) and (D):

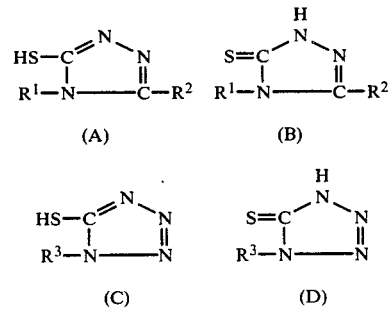

wherein:
$R^1$ represents hydrogen, amino or acylamino,
$R^2$ represents an alkyl group, and
$R^3$ represents an alkyl group, or an alkanamido-arylene group.

8 Claims, No Drawings

METHOD FOR THE PREPARATION OF A PLANOGRAPHIC PRINTING PLATE USING NIS CONTAINING NUCLEI

This application is a continuation of application Ser. No. 466,656 filed Feb. 15, 1983, now abandoned.

The present invention relates to a method for the preparation of a planographic printing plate by converting a silver image into a hydrophobic ink-receptive image and to a liquid composition for improving the hydrophobic ink-receptivity of the silver image.

In planographic or lithographic printing a greasy ink is employed and the printing plate comprises according to a particular embodiment a support coated with a colloid carrier which when wet, is hydrophilic and commonly carries a line or dot image which is oleophilic.

In practice such a printing plate is made through photograhic imaging forming an oleophilic image on a hydrophilic surface.

Photolithographic printing plates may be made by a silver halide photographic process. For the formation of positive printing plates it is known to use silver images produced according to the silver complex diffusion transfer reversal (DTR-) process.

Thus, it is known e.g. from the United Kingdom Patent Specification No. 1,241,661 to produce a planographic printing plate by the use of a sheet material comprising an outer hydrophilic colloid layer having concentrated on it surface a silver image formed from complexed silver halide by the silver complex diffusion transfer reversal process.

To obtain good prints with any printing plate it is necessary that the difference in hydrophilic and oleophilic properties of the image and background surface be sufficiently distinct so that when water and ink are applied, the image will accept sufficient ink leaving the background clean.

According to the method for the preparation of a planographic printing plate described in the above U.K. Patent Specification the thus prepared silver image is rendered hydrophobic with an aqueous liquid, called "lithographic fixer", which liquid has a pH-value between 7 and 12 and contains (1) potassium hexacyanoferrate (III) by means of which the silver image is at least superficially oxidized, and (2) a thione compound or tautomeric mercapto compound thereof that is at least in part dissolved in said liquid and which reacts with the oxidized silver image to render the same hydrophobic.

Although the lithograhic fixer described in the above-mentioned Patent Specification has particularly favourable hydrophobizing properties some disadvantages are associated therewith. For example the cyanoferrate(III) ion originating from the potassium hexacyanoferrate(III) under the defined condition of a relatively high pH is not inert with respect to the mercapto compounds which are tautomeric with the incorporated thione compounds and hence in time reduce the hydrophobizing properties of the lithographic fixer. Further as a consequence of the reduction of hexacyanoferrate(III) ions by the mercapto compounds, cyanoferrate(II) ions are formed which produce by reaction with the excess cyanoferrate(III) ions a blue precipitate that may cause staining of the plate.

In order to avoid the use of cyanoferrate(III) ions it has been proposed in the United Kingdom Patent Specification No. 1,435,900 to oxidize the silver image with (1) an iron(III) ammonium salt of an aliphatic dicarboxylic acid forming free silver ions which are allowed to react with (2) oxide ions and (3) an organic nitrogen-containing compound having a thiol group or in its tautomeric structure a thione group as represented in the following tautomeric groups:

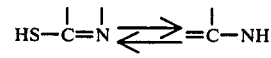

The substances (1), (2) and (3) are applied from the same aqueous liquid, called lithographic fixer, having a pH-value in the range of 4.5 to 7.2.

According to U.K. Patent Specification No. 1,373,415 organic compounds having a

or $<C=S$ group may be used to oleophilize a non-oxidized metallic silver image which has been formed on an image-receiving sheet by the silver complex diffusion transfer process. The surface of such image-receiving sheet contains nuclei for physical development and 0 to 30% by weight of said nuclei of one or more film-forming hydrophilic compounds having a binding action. The developing nuclei may be chosen from Au, Ag, Cu, Se, Cd, Zn, CuS, Ag₂S, HgS, PdS and ZnS as described in the U.K. Patent Specification No. 1,326,088.

According to U.K. Patent Specification No. 1,373,415 preferred sulphur compounds used for the hydrophobizing of the DTR-silver image are within the scope of the following general formulae:

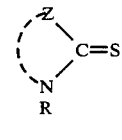

or

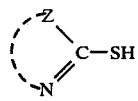

wherein R is hydrogen, alkyl having not more than 12 carbon atoms, aryl or aralkyl and Z completes a heterocyclic nucleus containing 5- or 6-members in the heterocyclic ring containing the N and C atoms shown. In the majority of the Examples here image-receiving materials containing palladium sulphide nuclei are used in conjunction with an oleophilizing liquid containing one of the following mercapto compounds:
3-mercapto-4-acetamido-5-n-heptyl-1,2,4-triazole,
3-mercapto-4-amino-5-heptadecyl-1,2,4-triazole,
1-ethyl-2-mercapto-benzimidazole,
3-ethyl-benzothiazoline-2-thione, and
1,5-dimercapto-3,7-difenyl-s-triazolino-[1,2-a]-triazoline.

According to U.S. Pat. No. 3,776,728 a method of producing an offset printing plate is provided which method utilizes the silver complex diffusion transfer process, and which comprises treating an offset master plate containing an image-receiving layer composed of 100 parts by weight of physical development nuclei and not more than 30 parts by weight of a high-molecular-weight compound, with a transfer developer solution consisting essentially of a developing agent, a solvent for a silver halide and at least one organic compound of the following formulae:

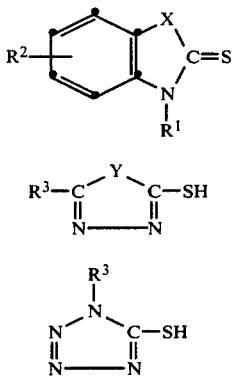

wherein:
$R^1$ is a lower alkyl group;
$R^2$ is a member selected from the group consisting of a hydrogen atom, lower alkyl groups and alkoxy groups;
$R^3$ is a member selected from the group consisting of lower alkyl groups, aryl groups and substituted aryl groups;
X is —O—, —S— or

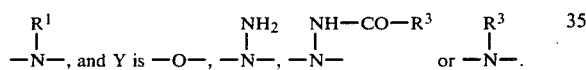

The development nuclei are broadly disclosed as fine particles of heavy metal or its sulphide and the master plate materials of the Examples contain silver sol development nuclei.

It has been established experimentally by us that the hydrophobization of a DTR-silver image formed at the surface of a hydrophilic colloid layer depends on the type of development nuclei present on that surface. Comparative tests described later sustain these findings. It has further been established experimentally that a particular group of mercapto compounds when applied from an aqueous liquid with a pH range of 5 to 6 and free from developing agent and silver halide solvent yields particularly good hydrophobization of a non-oxidized DTR-silver image when NiS nuclei or mixed crystal NiS.Ag$_2$S nuclei in which the molar ratio of NiS to Ag$_2$S is not smaller than 1:1 are used whereas these compounds fail or yield inferior results when used with non-oxidized silver images formed on Ag$_2$S nuclei alone or PdS-nuclei. It has been established also by us that this hydrophobization is still good even when the weight ratio of hydrophilic colloid e.g. gelatin to these NiS or mixed crystal NiS.Ag$_2$S nuclei in the coating composition of the outer layer is up to 4:1 but preferably in the range of 1:1 to 3:1.

It is therefore one of the objects of the present invention to provide a method for the preparation of a planographic printing plate including the improved hydrophobization of a non-oxidized DTR-silver image formed by physical development of silver complex compounds on NiS-nuclei or mixed crystal nickel sulphide-silver sulphide (NiS.Ag$_2$S) nuclei present in a particular weight ratio in a supported hydrophilic colloid layer.

It is another object of the present invention to provide a hydrophobizing solution for such a silver image.

Further objects will become apparent from the description hereinafter.

According to the present invention a method for the preparation of a planogrphic printing plate is provided wherein a sheet material, which comprises an exterior hydrophilic colloid layer on the surface of which is concentrated a silver image formed by the silver complex diffusion transfer process with development nuclei the major proportion of which is concentrated at the top of the exterior layer, is treated with a liquid for hydrophobizing the silver image, characterized in that the nuclei are NiS or mixed crystal NiS.Ag$_2$S nuclei in which the molar ratio of NiS to Ag$_2$S is not smaller than 1:1, that the hydrophilic colloid to nuclei weight ratio in the exterior layer is not higher than 4:1, and that the treatment liquid is free from developing agent(s) and silver halide solvent(s), has a pH in the range of 5 to 6, and contains in dissolved state a heterocyclic compound corresponding to one of the following tautomeric structures (A) and (B) or (C) and (D):

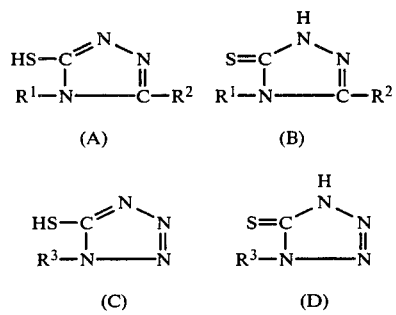

wherein:
$R^1$ represents hydrogen, amino or acylamino e.g. acetylamino,
$R^2$ represents an alkyl group, preferably an alkyl group containing from 5 to 16 C-atoms, and
$R^3$ represents an alkyl group, preferably alkyl containing from 5 to 16 C-atoms or an alkanamido-arylene group e.g. a n-heptanamido-phenylene group.

Compounds within the scope of general formulae (A) or (B) are listed in Table 1 with their melting points.

TABLE 1

| Compound no. | Structural formula | Melting point °C. |
|---|---|---|
| 1 | HS—C(=N)—N, H—N——C—(CH$_2$)$_4$—CH$_3$ | 188–190 |
| 2 | S=C(NH)—N, HN——C—(CH$_2$)$_6$—CH$_3$ | 190 |
| 3 | S=C(NH)—N, HN——C—(CH$_2$)$_8$—CH$_3$ | 184 |

TABLE 1-continued

| Compound no. | Structural formula | Melting point °C. |
|---|---|---|
| 4 | 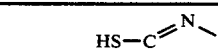 | 180 |
| 5 | 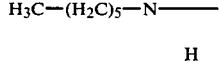 | 122 |
| 6 | 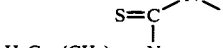 | 157 |

Compounds within the scope of general formulae (C) or (D) are listed in Table 2 with their melting points.

TABLE 2

| Compound no. | Structural formula | Melting point °C. |
|---|---|---|
| 7 | HS—C(=N—N)—N(C$_5$H$_2$—CH$_3$)—N | oily product |
| 8 | 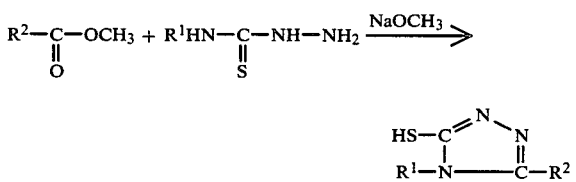 | 68 |
| 9 | H$_3$C—(CH$_2$)$_8$—CO—NH—⌬—N—C(=S)(NH)—N=N | 182 |

The preparation of compounds according to formulae (A) and (B) may proceed according to the following reaction scheme:

$$R^2\text{—}\underset{\underset{O}{\parallel}}{C}\text{—OCH}_3 + R^1\text{HN}\text{—}\underset{\underset{S}{\parallel}}{C}\text{—NH—NH}_2 \xrightarrow{\text{NaOCH}_3}$$

HS—C(=N—N)—N(R$^1$)—C—R$^2$ (ref. Bull.Soc.Chim.France (1961) 1581–1585).

A detailed preparation of compounds 2 and 5 is given hereinafter.

Preparation of compound 2

In a 2 l-reaction flask 23 g (1 mole) of sodium were dissolved in 1 l of anhydrous methanol. Thereupon 91 g (1 mole) of thiosemicarbazide and 158 g (1 mole) of methylcaprylate were added and the reaction mixture was boiled under reflux for 16 h. After removing the solvent by evaporation the residue was dissolved in 200 ml of water and 70 ml of acetic acid were added. The precipitate was separated by suction filtering (yield: 107 g). Recrystallization from dichloroethane yielded white crystals of compound 2 with melting pount: 190° C.

Preparation of compound 5

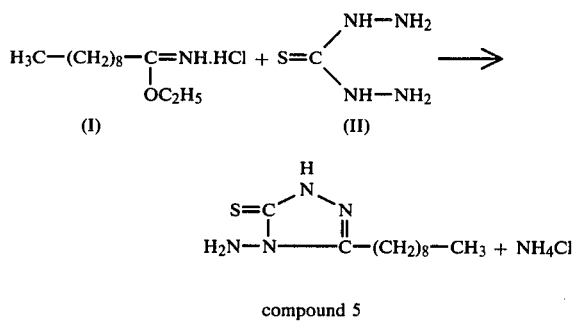

compound 5

86.3 g (0.366 mole) of compound (I) and 40 g (0.377 mole) of compound (II) were introduced into 400 ml of anhydrous ethanol and whilst stirring boiled with reflux for about 18 h. After hot filtering to separate the solid NH$_4$Cl the filtrate was cooled down whereby white crystals were obtained. Yield: 50 g. The crude product was recrystallized from anhydrous ethanol after boiling with active carbon. Melting point: 122° C.

The preparation of compounds according to formulae (C) and (D) can proceed according to the following reaction scheme:

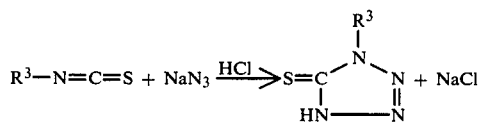

The detailed preparation of compounds 7 and 9 is given hereinafter.

Preparation of compound 7

42.9 g (0.3 mole) of n-hexylisothiocyanate were dissolved in 150 ml of dioxan and to the solution 21.4 g (0.33 mole) of sodium azide dissolved in 120 ml of water were added dropwise whilst stirring. Thereupon the reaction mixture was boiled with reflux for about 16 h. The dioxan was removed by evaporation and 100 ml of water were added and the aqueous layer treated with ether and after acidification with 5N hydrochloric acid treated again with ether to extract the tetrazole compound. The ether extract was dried on anhydrous sodium sulphate and after filtering and evaporation of the ether 37 g of an oily product was obtained containing according to mercapto group analysis 91.3% by weight of compound 7.

Preparation of compound 9

In a reaction flask of 500 ml equipped with a stirrer, dropping funnel and thermometer 19.3 g (0.1 mole) of 1-(3'-aminophenyl)-1,2,3,4-tetrazole-5-thione was introduced and whilst heating dissolved in a mixture of 200 ml of anhydrous dioxan and 9 ml of pyridine. The obtained solution was cooled down to room temperature and whilst stirring a solution of 19.05 g (0.1 mole) of caproylchloride dissolved in 50 ml of dioxan were added dropwise within a period of 20 min. The reaction temperature attained about 40° C. The reaction mixture was poured into 600 ml of an ice-water mixture containing 10 ml of concentrated hydrochloric acid. The whole mixture was stirred for 30 min and the obtained precipitate separated by suction filtering and washed with water till neutral. Yield: 37 g. Melting point: 180° C. after extraction with ether.

Of these heterocyclic compounds those that are not or only slowly penetrating by diffusion into hydrophilic colloid layers are preferred. Therefore they contain in their structure preferably a hydrocarbon residue of at least 5-C atoms in straight line. On the other hand, however, they may not be insoluble in the liquid wherefrom they are applied. For preparing a hydrophobizing solution according to the present invention it is advantageous to use aqueous compositions containing (a) organic water-miscible solvent(s) e.g. ethanol, n-propanol, methyl ethyl ketone, tetrahydrofuran or ethylene glycol monoacetate for improving the dissolution of the heterocyclic compound and a pH-controlling compound to bring the pH in the range of 5–6. The concentration of heterocyclic mercapto or thione compounds in the silver image-hydrophobizing liquid may vary within wide limits but should in dissolved state preferably be at least 0.5 g/l.

The silver image-hydrophobizing liquid used in the present invention is very stable to aerial oxidation and to temperature fluctuations and is suited particularly for the production of planograhic printing plates having non-staining image background parts.

A condition for an adequate image differentiation in terms of hydrophobic i.e. oleophilic image areas on a hydrophilic image background is the presence of the DTR-silver image at the surface of a hydrophilic colloid layer. Therefor it is necessary to use a silver image receiving element wherein the major proportion of the development nuclei is concentrated atthe surface of the outer hydrophilic colloid layer rather than being distributed throughout the latter. For that purpose in the preparation of a suitable image receiving material for silver image hydrophobization according to the invention, the outer or exterior hydrophilic colloid layer of such material contains not more than 4:1 by weight of hydrophilic colloid binder with respect to the nuclei.

The coverage of development nuclei at the image-receiving surface is preferably in the range of 0.001 g/m2 to 0.06 g/m2.

The preparation of nickel sulphide and of mixed nickel sulphide-silver sulphide nuclei may proceed in aqueous medium by mixing a water-soluble nickel compound and optionally a water-soluble silver compound e.g. the nitrates or acetates with a water-soluble sulphite e.g. alkali metal sulphide or ammonium sulphide in the presence of up to a maximum of 400% by weight with respect to the nuclei of hydrophilic protective colloid e.g. gelatin and optionally a non-ionic dispersing agent e.g. a polyoxyalkylene glycol or derivative thereof which can penetrate into a swollen gelatin layer and leave at least a major part of the nuclei adherent on top thereof. Such proceeds much easier with nickel sulphide nuclei, for the density of NiS is much less than of $Ag_2S$ and PdS. A more detailed preparation of the development nuclei used in the process of the present invention is given in the Examples 1 and 2.

The DTR-process for producing a planographic printing plate according to the present invention may proceed with a light-sensitive silver halide emulsion material and a separate image-receiving material or with a unitary or mono-sheet material both the silver halide emulsion layer and image-receiving layer on one and the same support. Such unitary sheet material is described e.g. in the United Kingdom Patent Specification No. 1,241,662.

In such materials there may be incorporated in the image-receiving material and/or light-sensitive materials substances that are essential or useful for carrying out the diffusion transfer image formation, e.g. developing agents, preservatives for these developing agents, complexing agents, stabilizers, e.g. 1-cyclohexyl-5-mercapto-tetrazole, black-toning agents, hardeners and softening agents, so that the aqueous processing liquid need only be an aqueous solution of alkaline substances, or merely water, the latter technique being described in United Kingdom Patent Specification No. 1,013,343. The incorporation of developing agents and preservatives thereof into the light-sensitive and/or image-receiving material for diffusion transfer processes is described in United Kingdom Patent Specifications Nos. 1,093,177-1,000,115-1,012,476-1,042,477-1,054,253 and 1,057,273.

For the preparation of the outer hydrophilic colloid layer whereon the DTR-silver image is formed, any hardenable hydrophilic colloid is suitable. Although gelatin is favoured, other hardenable hydrophilic colloids such as polyvinyl alcohol, casein, carboxymethyl cellulose and sodium alginate can be used likewise.

Hardening of the hydrophilic colloid layer may occur before, during or after the treatment with the silver image-hydrophobizing liquid and must occur at least to such an extent that no substantial amount of colloid is transferred during printing either to the rollers for applying water and ink to the printing plate or to the material to be printed. In other words hardening (i.e. insolubilizing in water and strengthening against mechanical damage) must occur at least to such an extent that the material obtained can be used as planographic printing plate.

The said hardening preferably occurs before the treatment with the silver-hydrophobizing liquid. In that case the hardening may be effected by addition of generally known hardening agents for gelatin and similar colloids, such as formaldehyde or glyoxal, to the coating composition of the outer layer, at the surface of which the silver pattern is to be produced, and/or to the coating composition of a sub-layer, with which the outer layer is in water-permeable relationship whereby hardening of the outer layer takes place by diffusion of hardener from the other layer to the outer layer. When the outer coating comprises the development nuclei together with an amount of hydrophilic colloid sufficient to keep the development nuclei in dispersion but insufficient to completely envelope the nuclei on top of the silver halide emulsion layer, the hardeners can be incorporated likewise into the coating composition of the outer layer. Hardening of the hydrophilic colloid binder of the outer layer may occur likewise during the production of the silver image. The hardening may be effected by incorporating latent hardeners in one or more layers of the sheet material, whereby a hardener is released at the stage of the application of an alkaline processing liquid for carrying out the silver complex diffusion transfer process. These latent hardeners are active only within a well defined pH-range, mostly the pH-range of the usual developing liquids. Finally, hardening of the outermost hydrophilic colloid layer can also occur after the production of the silver pattern namely by treatment with a hardening liquid. Embodiments in which hardening agents and more particularly latent hardening agents are incorporated into the light-sensitive and/or image-receiving material are described e.g. in United Kingdom Patent Specification No. 962,483 and German Patent Specification No. 1,203,604.

The image sharpness of the silver pattern and, as a consequence thereof, the sharpness of the final printed copy can be improved by applying antihalation dyes or pigments. These dyes or pigments may be present in the support, but preferably are incorporated into a layer situated between the silver halide emulsion layer and the support. If a transparent support is used, the antihalation dyes or pigments may be applied to the rear side of the material or on top of the emulsion layer dependent on the manner in which the exposure is carried out, viz. at the front side or through the support. Preferably a red or black antihalation dye or pigment is used. A useful optical density of an antihalation layer situated below the silver halide emulsion layer is in the range of 0.3 to 2.5 or higher.

Any silver halide emulsion of the negative or direct-positive type may be used depending on the nature of the original to be reproduced.

The silver halide emulsions can be spectrally sensitized for the whole or a part of the visible spectrum e.g. for use in laser beam recording. The usual mono- or polymethine dyes such as acidic or basic cyanines, hemicyanines, oxonols, hemioxonols, styryl dyes or others, also tri- or polynuclear methine dyes, e.g. rhodacyanines or neocyanines can be used. Such spectral sensitizers are described, e.g., by F. M. HAMER in "The Cyanine Dyes and Related Compounds" (1964) Interscience Publishers, John Wiley & Sons, New York.

Preferably emulsions of the negative type are used, having a sensitivity suitable for use in a camera. As a matter of fact, although the exposure of the silver halide emulsion layer may be carried out according to any usual technique e.g. by contact, by back reflection, by transmission or episcopically, preferably an episcopic exposure in a camera is used when the development nuclei are provided on top of the silver halide emulsion layer as described herein. The silver halide emulsion layer generally comprises an amount of silver halide equivalent to from 1.0 g/m2 to 2.5 g/m2 of silver nitrate and preferably amounting only to the equivalent of about 1.5 g/m2 of silver nitrate. If necessary a suitable subbing layer is provided for strongly adhering the hydrophilic colloid layer(s) to the support sheet.

The light-sensitive sheet materials for use in the printing plate production of the invention may comprise any suitable support, either in direct or indirect contact, e.g., by means of a suitable subbing layer and/or a hydrophilic colloid antihalation layer, with a silver halide emulsion layer.

According to a preferred embodiment, a photographic material is used which comprises successively a paper support layer, an antihalation layer, a silver halide emulsion layer and in the defined amount of hydrophilic colloid binder development nuclei on top thereof. Preference is given to paper supports coated at one or both sides with an alpha-olefin polymer, e.g. a polyethylene layer which optionally contains an anti-halation dye or pigment.

It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-alpha-olefin films such as polyethylene or polypropylene film.

Although with the present silver image hydrophobization liquid already from the first prints on a good ink acceptance is obtained still better results in print density from the first prints onward obtained when the developing liquid used in the DTR-process also contains silver image hydrophobizing compounds e.g. heterocyclic mercapto compounds. In the DTR-process the imagewise exposed silver halide is developed in the presence of a silver halide solvent acting as a silver halide complexing agent e.g. a watersoluble thiosulphate forming a diffusible silver complex compound with undeveloped silver halide which in complexed state is transferred by diffusion into the development nuclei containing layer.

The addition of heterocyclic mercapto compounds more particularly a mercapto-1,3,4-thiadiazole to a silver image developing liquid for use in the silver salt diffusion transfer process has been described in the German Auslegeschrift No. 1,228,927 with the purpose of hydrophobizing a silver image obtained on an aluminium foil by the silver salt diffusion transfer process.

Mercapto-thiadiazoles according to the following general formulae I and II are used preferably for initiating the hydrophobization of a silver image which hydrophobization is completed with the hydrophobizing liquid according to the present invention.

FORMULA I

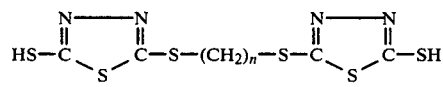

wherein n is 1 to 10, preferably 4 to 10.

FORMULA II

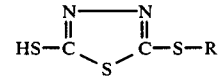

wherein: R is an alkyl group with at least 6 carbon atoms, preferably containing 6 to 18 carbon atoms.

Examples of compounds according to Formula I are listed in Table 3.

TABLE 3

| Compound | Number of groups | Melting point (°C.) |
|---|---|---|
| A | n = 1 | 174 to 176 |
| B | n = 2 | 214 to 216 |
| C | n = 3 | 162 to 163 |
| D | n = 4 | 191 to 193 |
| E | n = 6 | 162 to 163 |
| F | n = 10 | 131 to 132 |

Examples of compounds according to Formula II are listed in Table 4.

TABLE 4

| Name | Melting point (°C.) |
|---|---|
| 2-methylmercapto-5-mercapto-1,3,4-thiadiazole | 138 |
| 2-ethylmercapto-5-mercapto-1,3,4-thiadiazole | 126 |
| 2-n-propylmercapto-5-mercapto-1,3,4-thiadiazole | 103 |
| 2-n-butylmercapto-5-mercapto-1,3,4-thiadiazole | 98 |
| 2-n-hexylmercapto-5-mercapto- | 70 to 71 |

TABLE 4-continued

| Name | Melting point (°C.) |
|---|---|
| 1,3,4-thiadiazole 2-n-octylmercapto-5-mercapto-1,3,4-thiadiazole | 78 to 79 |
| 2-n-decylmercapto-5-mercapto-1,3,4-thiadiazole | 84 to 86 |
| 2-n-dodecylmercapto-5-mercapto-1,3,4-thiadiazole | 86 to 87 |
| 2-n-tetradecylmercapto-5-mercapto-1,3,4-thiadiazole | 90 to 91 |
| 2-n-hexadecylmercapto-5-mercapto-1,3,4-thiadiazole | 91 to 92 |
| 2-n-octadecylmercapto-5-mercapto-1,3,4-thiadiazole | 95 to 96 |

The hydrophobizing substances according to one of the formulae I and II are added to the developer liquid in an amount of preferably 0.1 to 3 g per liter and preferably in admixture with 1-phenyl-mercaptotetrazole, the latter compound being used in amounts of e.g. 50 to 100 mg per liter of the developer liquid which may contain a minor amount of ethanol to improve the dissolution of these compounds.

Apart from the conventional developing agents for DTR-processing such as hydroquinone and 1-phenyl-3-pyrazolidinone compounds the developing liquid may contain as alkali-providing substances alkali metal salts of phosphoric acid and/or silicic acid e.g. trisodium phosphate, orthosilicates, metasilicates and hydrodisilicates of sodium or potassium.

Before treating the DTR-silver image after its development with the present hydrophobizing liquid, development is stopped with a so-called stabilization liquid which actually is an acidic stop-bath having preferably a pH in the range of 5 to 6.

Buffered stop bath compositions having a pH in this range are preferred and can be obtained with a mixture of sodium dihydrogen orthophosphate and disodium hydrogen orthophosphate.

At the moment the treatment with the hydrophobizing liquid starts, the outer hydrophilic colloid layer carrying the silver pattern may be in a dry or wet condition. Generally the treatment with the hydrophobizing liquid does not last long, mostly not longer than about 15 seconds. The plate may be stored for a long time before being treated and even thereafter it may be stored for a long time i.e. weeks before being used in the printing process. Preferably, however, the silver image-hydrophobizing step is carried out just before printing.

The hydrophobizing liquid and likewise the development or activating liquid for the production of the diffusion transfer image can be applied in different ways, e.g. by rubbing with a roller, by wiping with an absorbent means e.g. with a plug of cotton or sponge, or by dipping the material to be treated in the liquid composition. The image hydrophobizing step of the printing plate may proceed automatically by conducting passing the plate through a device having a narrow channel filled with the hydrophobizing composition and conveying the printing plate at the end of the channel between two squeezing rollers removing the excess of liquid.

The production of a silver image on top of an outer hydrophilic colloid layer and the treatment with the hydrophobizing liquid may occur in one and the same compact processing unit comprising the necessary processing stations.

In a particular embodiment the camera unit for effecting the exposure is associated with a 2 bath-roller processing unit wherein development and stabilization takes place. Hydrophobization proceeds at any time outside the camera unit. According to a preferred embodiment stabilization and hydrophobization takes place in a RAPILITH (registered trade name of Agfa-Gevaert N.V. Belgium) processor type D-38 wherein the material is conveyed by rollers operating at constant speed through a stabilization tray and hydrophobization tray within approximately 10 s pass-through time for each liquid.

After the application of the hydrophobizing liquid the sheet material is immediately ready for inking and use as a printing plate so that a treatment of the material with a lacquer composition for strengthening the printing parts is not necessary. The printing plate has to be wet at the stage the greasy printing ink is applied. This is generally known in the art and it is usual to apply an aqueous liquid before applying the printing ink. This may occur by means of a wet sponge or by means of the fountain arrangements (damping system) of the printing machine.

According to a particular embodiment at least one compound for improving the hydrophilic properties of the non-printing areas is applied during the preparation of the printing plate.

For that purpose certain hydrophilic colloid binders e.g. carboxymethylcellulose, gum arabic, sodium alginate, propyleneglycol ester of alginic acid, hydroxyethyl starch, dextrine, hydroxyethylcellulose, polyvinylpyrrolidone, polystyrene sulphonic acid and polyvinyl alcohol may be applied in the aqueous liquid. Alternately or in addition, hygroscopic substances e.g. sorbitol, glycerol, tri(hydroxyethyl)ester of glycerol and turkey red oil, and certain wetting agents, may be present.

In the following comparative test examples all parts and percentages are by weight unless otherwise stated.

EXAMPLE 1

Preparation of material A

To a corona-treated polyethylene coated paper support of 130 g per sq.m a black antihalation layer was coated from the following mixture:

| | |
|---|---|
| water | 800 ml |
| 35% aqueous dispersion of lampblack (average grain size 30 nm) | 21 g |
| gelatin | 64 g |
| 12.5% solution of saponine in a mixture of ethanol and water (80/20 by volume) | 21 ml |
| water to make | 1 l. |

The coating proceeded at a coverage of 1 liter/17.1 sq.m. The optical density of the black antihalation layer was 2.60.

Onto the antihalation layer an orthochromatically sensitized silver chlorobromide emulsion (1.8% of bromide) was applied so that an amount of silver halide equivalent to 1.5 g of silver nitrate was present per sq.m with a gelatin to silver nitrate ratio of 1. After drying of the silver halide gelatin emulsion layer, the latter was overcoated with the following composition to provide an image receiving layer at such a coating thickness as to obtain a development nuclei coverage of 0.0055 g per sq.m. demineralized water 520 ml

| | |
|---|---|
| demineralized water | 520 ml |

-continued

| | |
|---|---|
| aqueous ethanolic wetting agent solution containing 1% of sodium isotetradecyl sulphate | 180 ml |
| aqueous dispersion of colloidal NiS.Ag$_2$S nuclei prepared as described hereinafter | 50 ml |
| 5% aqueous formaldehyde solution | 250 ml |

After drying material A was exposed to an original and treated for 30 s in the following processing composition:

| | |
|---|---|
| demineralized water | 800 ml |
| sodium hydroxide | 40 g |
| anhydrous sodium sulphite | 50 g |
| potassium thiocyanate | 20 g |
| 1-phenyl-mercapto-tetrazole | 140 mg |
| hydroquinone | 20 g |
| 1-phenyl-3-pyrazolidinone | 5 g |
| anhydrous sodium thiosulphate | 2 g |
| water up to | 1000 ml |

The material was then dipped into an acidic stabilization liquid stopping the development and having the following composition:

| | |
|---|---|
| demineralized water | 800 ml |
| sodium dihydrogen orthophosphate.2 water | 60 g |
| disodium hydrogen orthophosphate.12 water | 10 g |
| water up to | 1000 ml |
| | (pH = 5.40) |

Following the stabilization material A was treated for 10 s with the following hydrophobizing liquid:

| | |
|---|---|
| demineralized water | 300 ml |
| isopropanol | 175 ml |
| compound 2 of Table 1 | 1 g |
| dibutylphthalate | 2.5 g |
| polyoxyethylene glycol (average molecular weight 4000) | 5 g |
| water up to | 1000 ml |
| | (pH = 5.25) |

The described treatment of the exposed material A yielded a positive planographic printing plate with very good printing characteristics already from the first prints on. More than 1000 prints of high quality were obtained. Applying a lithographic lacquer in order to strengthen the printing parts was not necessary.

The fountain solution used on offset printing with common oleophilic planographic ink could be water or a liquid having the following composition:

| | |
|---|---|
| water | 90 ml |
| glycerol | 10 ml |
| aqueous colloidal silica (30%) | 1 ml |
| aqueous phosphoric acid (1%) | 2 ml |

Preparation of the NiS.Ag$_2$S nuclei

| | |
|---|---|
| Liquid A: | |
| demineralized water | 10.140 l |
| gelatin | 0.260 kg |
| Liquid B: | |
| 10% aqueous solution of Na$_2$S | 1.880 l (2.40 mole) |
| aqueous anti-foaming agent solution A being a 10% solution of RO—(CH$_2$—CH$_2$O)$_x$—H wherein R is isopropyl and x between 1 and 10 | 0.110 l |
| Liquid C: | |
| 20% aqueous solution of Ni(NO$_3$)$_2$.6H$_2$O | 1.050 l (0.72 mole) |
| Liquid D: | |
| 50% aqueous solution of AgNO$_3$ | 0.064 l (0.18 mole) |

Liquids C and D were mixed beforehand with 0.286 l of demineralized water and added gradually with dropping funnel to the mixture of liquids A and B while subjecting the reaction mixture to high speed stirring. The gelatin to nuclei weight ratio was 2.36.

EXAMPLE 2

Example 1 was repeated with the difference, however, that the NiS.Ag$_2$S nuclei were replaced at a same coverage per sq.m by nickel sulphide nuclei.

Practically the same results were obtained with respect to the acceptance of the oleophilic ink.

Preparation of the nickel sulphide nuclei

| | |
|---|---|
| Liquid A: | |
| demineralized water | 780 ml |
| gelatin | 20 g |
| Liquid B: | |
| 10% aqueous solution of Na$_2$S | 120 ml (0.15 mole) |
| anti-foaming agent solution A | 1 ml |
| Liquid C: | |
| 15.37% aqueous solution of Ni(NO$_3$)$_2$.6H$_2$O | 198.5 ml (0.10 mole) |

Liquid B was mixed beforehand with liquid A and thereupon liquid C was gradually added thereto whilst high speed stirring. The gelatin to nuclei weight ratio was 2.20.

EXAMPLE 3

Example 1 was repeated with the difference however, that the NiS.Ag$_2$S nuclei were replaced at a same coverage per sq.m by silver sulphide nuclei.

Inferior results were obtained in ink acceptance and printing.

Preparation of the silver sulphide nuclei

| | |
|---|---|
| Liquid A: | |
| demineralized water | 358 ml |
| gelatin | 3.6 g |
| 50% aqueous solution of silver nitrate (pH: 5.2) | 7.2 ml (0.021 mole) |
| Liquid B: | |
| demineralized water | 722 ml |
| gelatin | 3.6 g |
| 6.3% aqueous solution of sodium sulphide | 3.6 ml (0.0028 mole) |

Liquid B was added gradually to liquid A whilst high speed stirring. The ratio of gelatin to nuclei was 1.38.

EXAMPLE 4

Example 1 was repeated with the difference however, that the NiS.Ag$_2$S nuclei were replaced at a same coverage per sq.m by palladium sulphide nuclei.

The ink acceptance was insufficient for printing.

Preparation of the palladium sulphide nuclei

| | |
|---|---|
| Liquid A: | |
| demineralized water | 1000 ml |
| PdCl$_2$ | 5 g |
| hydrochloric acid (0.1 N) | 40 ml |
| Liquid B: | |
| demineralized water | 1000 ml |
| Na$_2$S | 8.6 g |
| anti-foaming agent solution A of Example 1 | 30 ml |
| Liquid C | |
| demineralized water | 100 ml |
| gelatin | 3.9 g |

Liquid B was added to liquid A whilst high speed stirring and then liquid C was mixed therewith.

The gelatin to PdS nuclei weight ratio was 1:1. The preparation was repeated with a gelatin to PdS nuclei weight ratio of 3:1. In both cases the same poor ink acceptance was obtained.

EXAMPLES 5-12

Example 1 was repeated respectively with the compounds 1, 3, 4, 5, 6, 7, 8 and 9 of Tables 1 and 2 replacing in a same molar amount compound 2. Comparable good ink acceptance and printing results were obtained.

EXAMPLE 13

Example 1 was repeated with the difference, however, that the prepration of the mixed crystal nickel sulphide-silver sulphide nuclei proceeded in such a way that a 1:1 molar mixture was applied. Compared with Example 1 the obtained plate yielded a smaller run i.e. a smaller amount of good prints but was still of acceptable quality.

EXAMPLE 14

Example 1 was repeated with the difference however, that the weight ratio of gelatin to nuclei was 4:1. The printing results were not so good as in Example 1 but still acceptable. The ink acceptance proceeded slower.

EXAMPLE 15

Example 1 was repeated with the difference, however, that the preparation of the mixed crystal nickel sulphide-silver sulphide nuclei proceeded in such a way that a 73:1 molar ratio of NiS to Ag$_2$S was applied and the nuclei were coated at a coverage of $3.99\times10^{-9}$ g/sq.m of NiS and $1.63\times10^{-3}$ g/sq.m of Ag$_2$S. Ink acceptance and printing results were very good.

What is claimed is:

1. A method for the preparation of a planographic printing plate which comprises treating a sheet material having an outer gelatin colloid layer on the surface of which is concentrated a silver image formed by the silver complex diffusion transfer process on development nuclei the major proportion of which is concentrated at the top of said outer layer, wherein said nuclei are NiS or mixed crystal NiS.Ag$_2$S nuclei in which the molar ratio of NiS to Ag$_2$S is not smaller than 1:1 and the hydrophilic colloid to nuclei weight ratio in said outer colloid layer is at least 1:1 but not higher than 4:1, with an aqueous liquid for hydrophibizing said silver image, wherein said liquid is free of any oxidizing agent, developing agent and silver halide solvent, has a pH in the range of 5 to 6, and contains in dissolved state a heterocyclic compound corresponding to one of the following tautomeric structures (A) and (B) or (C) and (D):

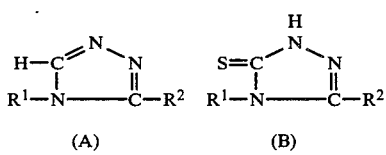

(A)   (B)

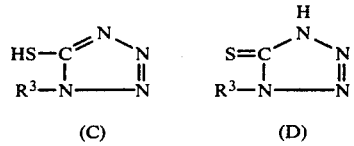

(C)   (D)

wherein:
R$^1$ represents hydrogen, amino or acylamino,
R$^2$ represents an alkyl group having 5-16 carbon atoms, and
R$^3$ represents an alkyl group having 5-16 carbon atoms, or an alkanamido-arylene group,
whereby the hydrophobic ink-receptivity of the unoxidized silver image is improved.

2. A method for the preparation of a planograhic printing plate according to claim 1, characterized in that R$^2$ and R$^3$ are alkyl groups containing from 5 to 16 C-atoms.

3. A method for the preparation of a planographic printing plate according to claim 1, characterized in that the hydrophobizing liquid contains at least one organic water-miscible solvent to improve the dissolution of said heterocyclic compound which is present in an amount of at least 0.5 g per liter in dissolved state.

4. A method for the preparation of a planographic printing plate according to claim 1, characterized in that the heterocyclic compound is 3-n-heptyl-1,2-4-triazole-5-thione.

5. A method for the preparation of a planographic printing plate according to claim 1, characterized in that said development nuclei are applied to said hydrophilic colloid layer in the presence of hydrophilic protective colloid in a hydrophilic colloid to nuclei weight ratio of 1:1 to 3:1.

6. A method for the preparation of a planographic printing plate according to claim 1, characterized in that said hydrophilic colloid is gelatin.

7. A method for the preparation of a planographic printing plate according to claim 1, characterized in that the development of the silver image produced by the silver complex diffusion transfer process proceeds with a developing liquid containing a mercapto-1,3,4-thiadiazole.

8. A method according to claim 7, characterized in that the mercapto-1,3,4-thiadiazole corresponds to the one of the following structural formulae (I) or (II):

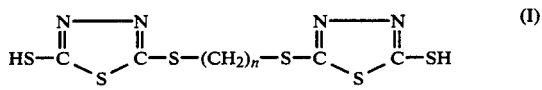

wherein n is 1 to 10, and

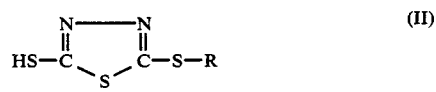

wherein R is an alkyl group with at least 6 carbon atoms.

* * * * *